United States Patent
Schrödinger

(10) Patent No.: US 6,937,078 B2
(45) Date of Patent: Aug. 30, 2005

(54) CIRCUIT CONFIGURATION FOR REGENERATING CLOCK SIGNALS

(75) Inventor: Karl Schrödinger, Berlin (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/622,937

(22) Filed: Jul. 18, 2003

(65) Prior Publication Data

US 2004/0051573 A1 Mar. 18, 2004

(30) Foreign Application Priority Data

Jul. 18, 2002 (DE) .......................................... 102 33 243

(51) Int. Cl.[7] .............................................. H03K 5/01
(52) U.S. Cl. ....................... 327/165; 327/292; 327/296
(58) Field of Search ................................ 327/165–167, 327/170, 171, 105, 141, 291–299, 560–563; 326/28; 330/252, 253, 259–261

(56) References Cited

U.S. PATENT DOCUMENTS

| | | | | |
|---|---|---|---|---|
| 4,395,681 A | * | 7/1983 | Hornung et al. | 330/259 |
| 5,061,900 A | * | 10/1991 | Vinn et al. | 330/9 |
| 5,600,280 A | * | 2/1997 | Zhang | 331/57 |
| 5,621,319 A | | 4/1997 | Bilotti et al. | 324/251 |
| 5,726,588 A | * | 3/1998 | Fiedler | 326/63 |
| 6,081,162 A | * | 6/2000 | Johnson | 330/301 |
| 6,140,872 A | * | 10/2000 | McEldowney | 330/9 |
| 6,194,962 B1 | * | 2/2001 | Chen | 330/9 |
| 6,307,416 B1 | | 10/2001 | Heyne et al. | 327/259 |
| 6,310,495 B1 | * | 10/2001 | Zhang | 327/52 |
| 6,362,687 B2 | * | 3/2002 | Cox | 330/253 |
| 6,362,737 B1 | * | 3/2002 | Rodgers et al. | 340/572.1 |
| 6,388,521 B1 | * | 5/2002 | Henry | 330/258 |
| 6,426,674 B1 | * | 7/2002 | Davidescu | 330/9 |
| 6,538,490 B2 | * | 3/2003 | Yoshizawa | 327/307 |
| 6,633,191 B2 | * | 10/2003 | Hu | 327/323 |
| 6,690,225 B2 | * | 2/2004 | Kondo et al. | 327/307 |
| 6,710,645 B2 | * | 3/2004 | Isken et al. | 330/9 |

FOREIGN PATENT DOCUMENTS

| | | |
|---|---|---|
| DE | 695 25 517 T2 | 6/1996 |
| DE | 196 50 184 C2 | 6/1997 |
| DE | 199 09 536 C1 | 6/2000 |
| EP | 0 718 977 B1 | 6/1996 |
| JP | 60080313 A | 5/1985 |

* cited by examiner

Primary Examiner—Timothy P. Callahan
Assistant Examiner—Hai L. Nguyen
(74) Attorney, Agent, or Firm—Laurence A. Greenberg; Werner H. Stemer; Ralph E. Locher

(57) ABSTRACT

A circuit configuration regenerates clock signals. The circuit configuration includes an input differential amplifier, first and second inverters, and an offset compensation circuit. The input differential amplifier generates first and second amplified signals in response to first and second differential input clock signals. The first and second inverters generate a first and a second differential output clock signal. The offset compensation circuit controls the difference between the two output clock signals to zero or to a constant value. As an alternative to or in supplementation of the offset compensation circuit, it is possible to provide a control circuit for driving the two inverters, which shifts the input pulse shapes of the inverters to the optimum switching point of the inverters. The circuit configuration enables a regeneration of clock signals with simultaneous equalization of pulse distortions.

19 Claims, 8 Drawing Sheets

CIRCUIT CONFIGURATION FOR REGENERATING CLOCK SIGNALS

BACKGROUND OF THE INVENTION

Field of the Invention

The invention relates to a circuit configuration for the regeneration of clock signals. It is used in particular in CMOS circuits With high-frequency clock signals in the gigahertz range.

Clock signals having very high frequencies are increasingly required in integrated circuits and other applications. By way of example, the frequencies of the clock signals lie in the region of 3 gigahertz in complex CMOS circuits. In order to realize such high-frequency clock frequencies in integrated circuits, it is necessary to transmit the clock signals over several millimeters to centimeters on the chip with the integrated circuit. However, the line losses on a chip are relatively large. Therefore, it is necessary to regularly regenerate the clock signals.

Furthermore, distortions of the clock signal occur both in the amplitude and in the time domain, which can lead to reduced signal-to-noise ratios in the system and thus to problems during the clocking of the logic circuits. By way of example, CMOS inverters inherently generate pulse distortions, i.e. the HIGH-LOW edge has a different propagation time than the LOW-HIGH edge. Another problem may be that the HIGH or LOW states of a clock signal are too short. It is desirable to eliminate such distortions of the clock signal during the regeneration of the clock signals.

SUMMARY OF THE INVENTION

It is accordingly an object of the invention to provide a circuit configuration for regenerating clock signals that overcomes the hereinafore-mentioned disadvantages of the heretofore-known devices of this general type and that regenerates high-frequency clock signals in integrated circuits and, in the process, of equalizing pulse distortions of the clock signals to the greatest possible extent, in particular of providing regenerated clock signals with a full CMOS swing.

With the foregoing and other objects in view, there is provided, in accordance with the invention, a circuit configuration for regenerating clock signals, including an input differential amplifier, a first and second inverter, and offset compensation circuit. The input differential amplifier generates first and second amplified signals in response to a first and second differential input clock signal. The first and a second inverter are connected to the input differential amplifier and generate a first and a second differential output clock signal. The offset compensation circuit connects to the first and the second inverters and controls a difference between the two output clock signals to a constant value.

With the objects of the invention in view, there is also provided a further embodiment of a circuit configuration for regenerating clock signals that includes an input differential amplifier, first and second inverters, and a control circuit. The input differential amplifier generates first and second amplified signals in response to a first and second differential input clock signal. The first and second inverters connect to the input differential amplifier and generate a first and a second differential output clock signal from the first and second amplified signals. The control circuit for drives the two inverters and shifts input pulse shapes of the inverters to an optimum switching point of the inverters.

Accordingly, the invention is distinguished by an input differential amplifier for eliminating clock signal disturbances. The input differential amplifier eliminates, in particular, disturbances resulting from different propagation times or from different HIGH/LOW phases of the positive and negative clock signals. Furthermore, according to the invention, an offset compensation is performed in a subsequent control loop. The target variable for the control is the output signal of the circuit configuration, provided by two inverters. The controlled variable is the difference between the two inverter signals, which is controlled to zero. The offset compensation makes it possible to eliminate disturbances caused by a DC voltage offset on the mutually inverted clock signals. Such an offset may be brought about for example as a result of unequal load resistances or switching transistors.

The solution according to the invention thus provides a regenerated differential clock signal from which disturbances are largely eliminated.

A preferred refinement of the invention provides a control circuit for driving the two inverters that provide the output clock signal. This control circuit equalizes distortions at the output of the inverters, which are attributable to the fact that the switching thresholds of inverters vary greatly over process tolerances and the ambient temperature. The level position (i.e. the offset) for the inverter switching point is set precisely by the control circuit. This is achieved by a control voltage provided by a control amplifier of the control circuit. The control voltage superposes an offset voltage on the output signals of the differential amplifier that generates the drive signals for the two inverters. As a result, the input pulse shape for the respective inverter can be shifted to the optimum switching point of the inverter and an optimum output pulse shape of the output clock signal can be achieved.

The controlled variable for this further control is obtained from the average value of the first and second differential output clock signals. The desired value is provided by a voltage divider.

In an alternative refinement of the invention, the circuit configuration according to the invention has, besides the input differential amplifier, merely the control circuit for driving the two inverters. By contrast, an offset compensation circuit is not provided in this refinement. Besides the input differential amplifier, it is thus possible to provide the offset compensation circuit and/or the control circuit for driving the two inverters.

In a preferred refinement, the control amplifier of the offset compensation circuit is an integrator that makes two input signals available to the differential amplifier of the offset compensation circuit. In this case, a high-frequency filter may be connected upstream of the input of the integrator, nonlinear effects being avoided as a result of the filter. In the differential amplifier of the offset compensation circuit, an offset voltage is in each case superposed on the two output signals of the differential amplifier preferably by using two controlled currents and at least one resistor. Consequently, the offset of both the positive clock signal and the negative clock signal can be compensated for individually.

The (second) control amplifier of the control circuit for driving the two inverters is also preferably an integrator. The input signals of the second integrator, on the one hand the average value of the first and second differential output clock signals (Ep, En) and on the other hand a desired value, are preferably each provided by a voltage divider circuit.

The output of the second control amplifier is fed to a (third) differential amplifier, which, in response to the first and second amplified offset-compensated signals of the (second) differential amplifier of the offset compensation circuit and the output signal of the second control amplifier, generates first and second drive signals for the first and second inverters. In this case, the control amplifier preferably controls a current source of the third differential amplifier, which current source can provide a current by which an offset voltage is applied to the drive signals for the first and second inverters in order to correct the duty cycle distortion of the first and second inverters.

As an alternative, for the case where a separate control is present for each inverter, two controlled current sources of the third differential amplifier are provided, which in each case apply an individual offset voltage to the drive signals for the first and second inverters.

Preferably, all of the circuit components are embodied using CMOS technology. The clock frequency is preferably 3 GHz.

Other features that are considered as characteristic for the invention are set forth in the appended claims.

Although the invention is illustrated and described herein as embodied in a circuit configuration for regenerating clock signals, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2:
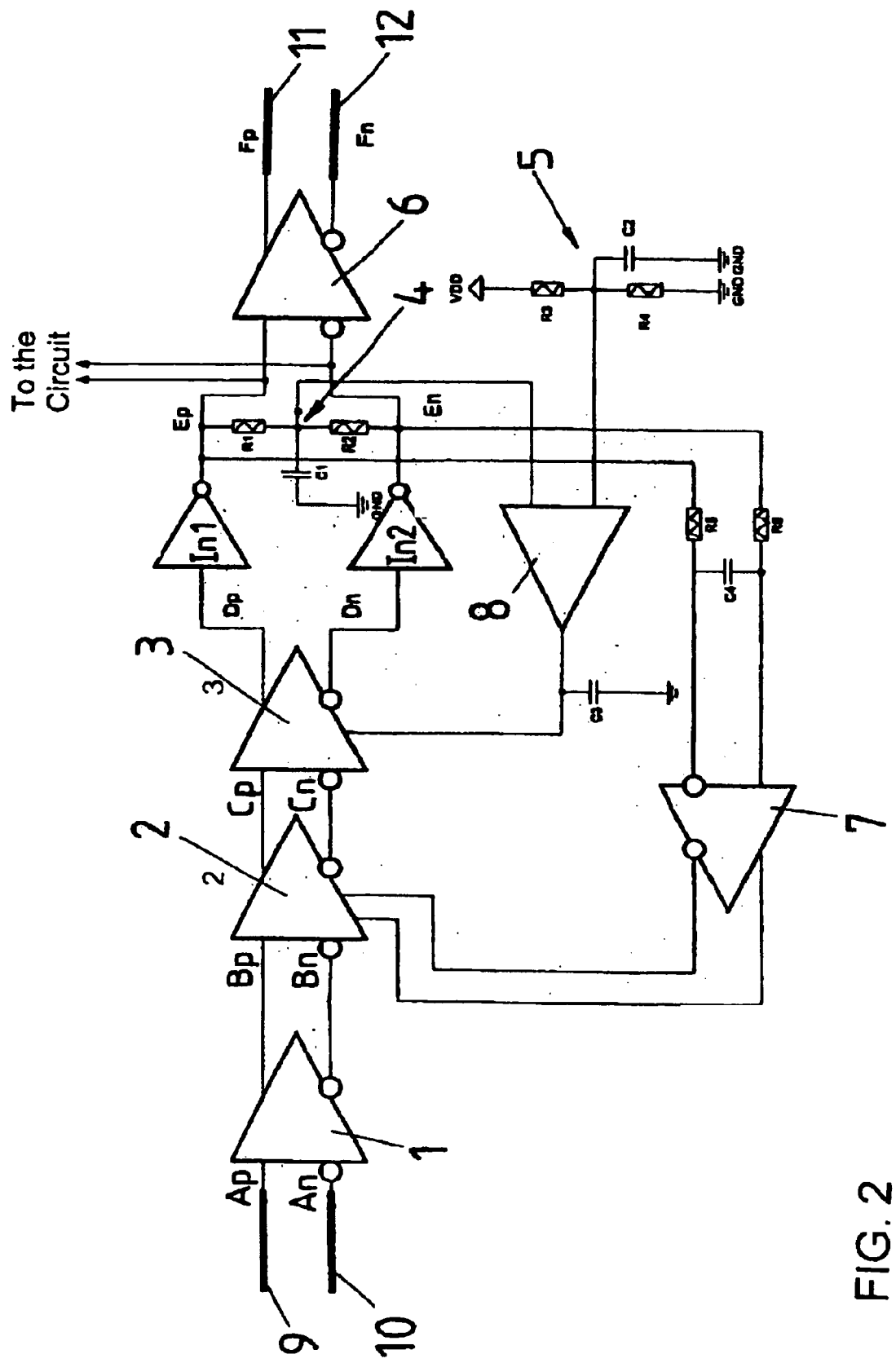
FIG. 2 is a circuit diagram of an exemplary embodiment of a circuit configuration for regenerating clock signals according to the invention.

Referring now to the figures of the drawings in detail and first, particularly to FIG. 2 thereof, there is shown the basic components of the circuit for the regeneration of clock signals. Accordingly, the circuit configuration has a first differential amplifier 1, a second differential amplifier 2, a third differential amplifier 3, two inverters In1, In2, two voltage dividers 4, 5, a differential line driver 6, a first integrator 7, and a second integrator 8.

The first differential amplifier 1 is an input amplifier and has, as input signal, a first and a second differential input clock signal Ap, An, which is fed to the differential amplifier by transmission lines 9, 10. The transmission lines may have wave guiding properties or a simple RC property, as is present e.g. in the case of relatively short lines on integrated circuits.

The differential amplifier 1 generates a first and a second amplified signal Bp, Bn in response to the first and second differential input clock signals Ap, An. The amplified signals Bp, Bn are fed to the second differential amplifier 2.

Figure 1A:
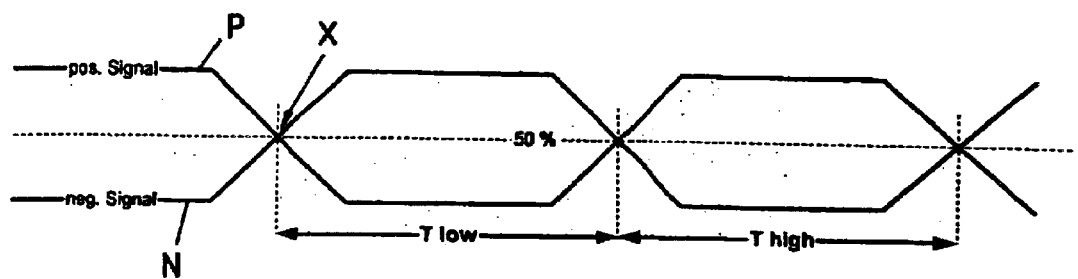
FIG. 1A is a plot showing an undistorted differential clock signal including a positive signal and a negative signal inverted with respect thereto.
Figure 1B:
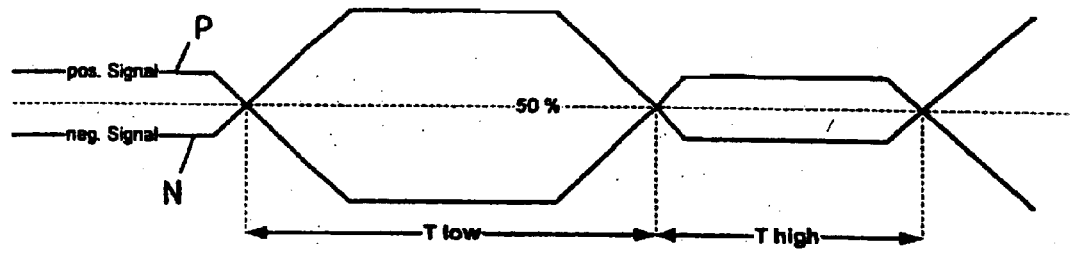
FIG. 1B is a plot showing a first distorted clock signal provided with an offset.
Figure 1C:
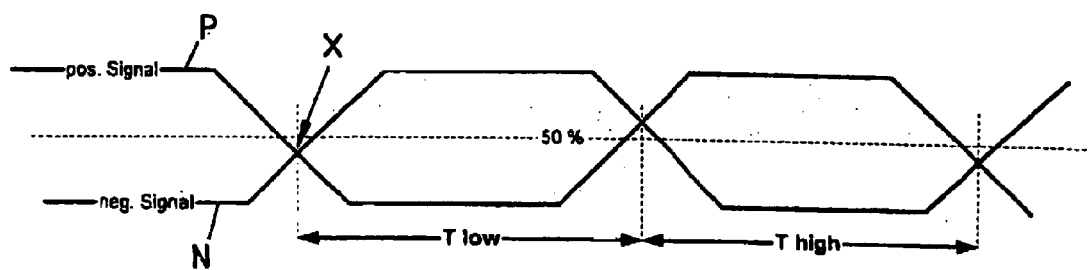
FIG. 1C is a plot showing a second distorted clock signal, in which one (negative) signal is time-delayed with respect to the other (positive) signal.
Figure 1D:
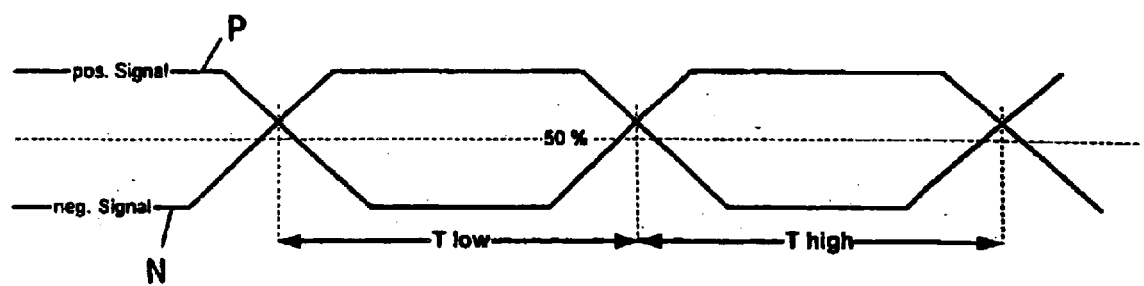
FIG. 1D is a plot showing a third distorted clock signal, in which the HIGH phase of the positive and negative signals is in each case longer than the LOW phase.
Figure 1E:
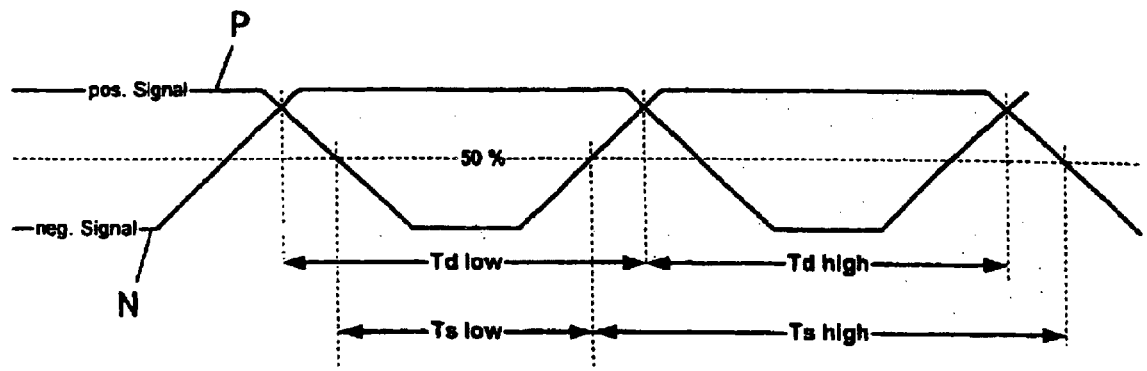
FIG. 1E is a plot showing a greatly distorted clock signal having the distortion illustrated in FIG. 1D to an amplified extent, as occurs for example after multiply passing through a CMOS inverter.

The input differential amplifier 1 eliminates disturbances of the clock signal, as are illustrated in FIGS. 1C to 1E. Firstly, FIG. 1A illustrates an undistorted, ideal clock signal including a positive signal P and a negative signal N, which are inverted with respect to one another. The pulse widths T high and T low have the same length. The points of inter-section of the two mutually inverted differential signals lie at 50 percent of the amplitude.

The clock signal of FIG. 1C exhibits a propagation time shift of the individual clock signals P, N, which is caused by different propagation times on the transmission link of the positive and negative signals. What is present in this case is not a distortion of the differential signal, but only a distortion of the individual signals P, N. This can lead to problems if a transition is made from the differential signal to two single-ended signals.

FIG. 1D shows a distorted signal in which the HIGH phase of each signal P, N is longer than the LOW phase. In a manner similar to that in FIG. 1C, here, too, it is not the differential signal but rather only the individual signals that are disturbed.

FIG. 1E shows the same, albeit amplified disturbance, as usually occurs when multiply passing through CMOS inverters. Although the pulse widths Td_high and Td_low with regard to the difference between the signals P, N have the same magnitude, the widths Ts_low and Ts_low with regard to the switching thresholds lying at 50% of the amplitude are different.

The input differential amplifier 1 eliminates disturbances of the clock signal in accordance with FIGS. 1C to 1E because the differential signal is not disturbed. The differential amplifier always changes over at the crossover point X of the positive signal P and the negative signal N. With regard to the correction of a propagation time shift (FIG. 1C), it is necessary for this that the delay be shorter than the respective rising or falling edge of the signal, and that the point of intersection X of the differential signals lies in the COMMON-MODE range of the differential amplifier.

Figure 4:
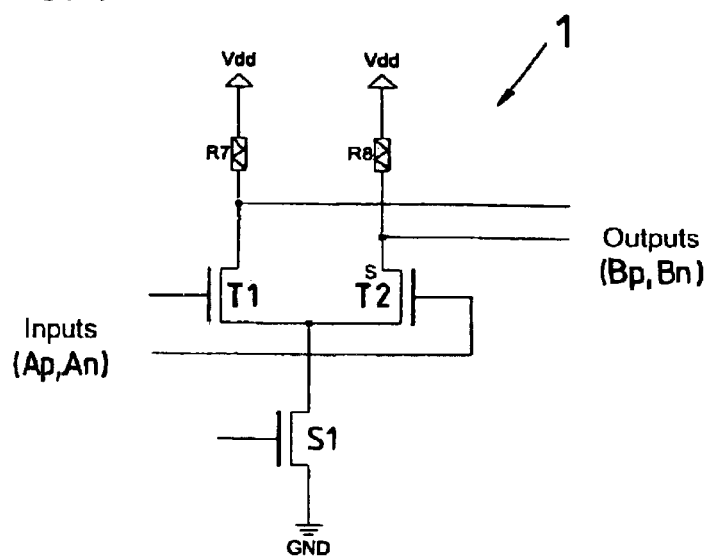
FIG. 4 is a circuit diagram showing an exemplary embodiment of a first differential amplifier used in FIG. 2.

An exemplary configuration of the input differential amplifier 1 is illustrated in FIG. 4. Accordingly, the differential amplifier 1 has two field-effect transistors T1, T2, to whose gate terminals the input clock signals Ap, An are applied. The source terminals are interconnected and connected to a current source S1. The drain terminals of the two transistors T1, T2 are respectively connected to a Vdd supply voltage via a resistor R7, R8. Furthermore, the drain terminals of the transistors T1, T2 are connected to outputs at which the first and second amplified signals Bp, Bn are present.

It is pointed out that the illustrated exemplary embodiment of a differential amplifier as well as the exemplary embodiments of other differential amplifiers and integrators below are to be understood merely by way of example. In principle, the differential amplifiers and integrators can also be realized by other circuits.

Although the amplified output signal Bb, Bn of the first differential amplifier 1 eliminates disturbances of the type described in FIGS. 1C to 1E, the differential amplifier 1 may also be defective. Moreover, there may be an offset on the line that the differential amplifier 1 cannot eliminate. Such an offset is illustrated in FIG. 1B. Unlike in FIG. 1A, which shows an undistorted, ideal signal, a signal with a DC voltage (DC) offset is present in FIG. 1B. Such a DC voltage offset may occur in the case of so-called current mode level signals (CML) and is caused for example by unequal load resistances or switching transistors. The pulse widths T high and T_low are shifted on account of the offset. Furthermore, the signal-to-noise ratio decreases and the differential amplitude decreases, as can be discerned in the clock phase T_high.

In order to eliminate such a distortion, the circuit illustrated in FIG. 2 has an offset compensation circuit section.

In order to explain the offset compensation circuit section, firstly it is pointed out that the differential output clock signal Ep, En of the circuit configuration is provided by two inverters In1, In2. The signals Ep, En are the actual useful signal for the circuit. The offset compensation circuit then has a control loop whose target variable for the control is the output signal Ep, En downstream of the two inverters. The controlled variable is the difference between the two inverter signals Ep, En. This is intended to be controlled to zero or to a constant value, since it can then be assumed that the disturbances of FIG. 1B (and also of FIGS. 1C to 1E) are no longer present.

The output signals of the two inverters In1, In2 are fed to the first integrator 7 via a high-frequency filter including a capacitor C4 and two resistors R5, R6. By using the high-frequency filter, which is optional, it is possible to avoid or filter out nonlinear effects as a result of high-frequency over-driving.

Figure 7:
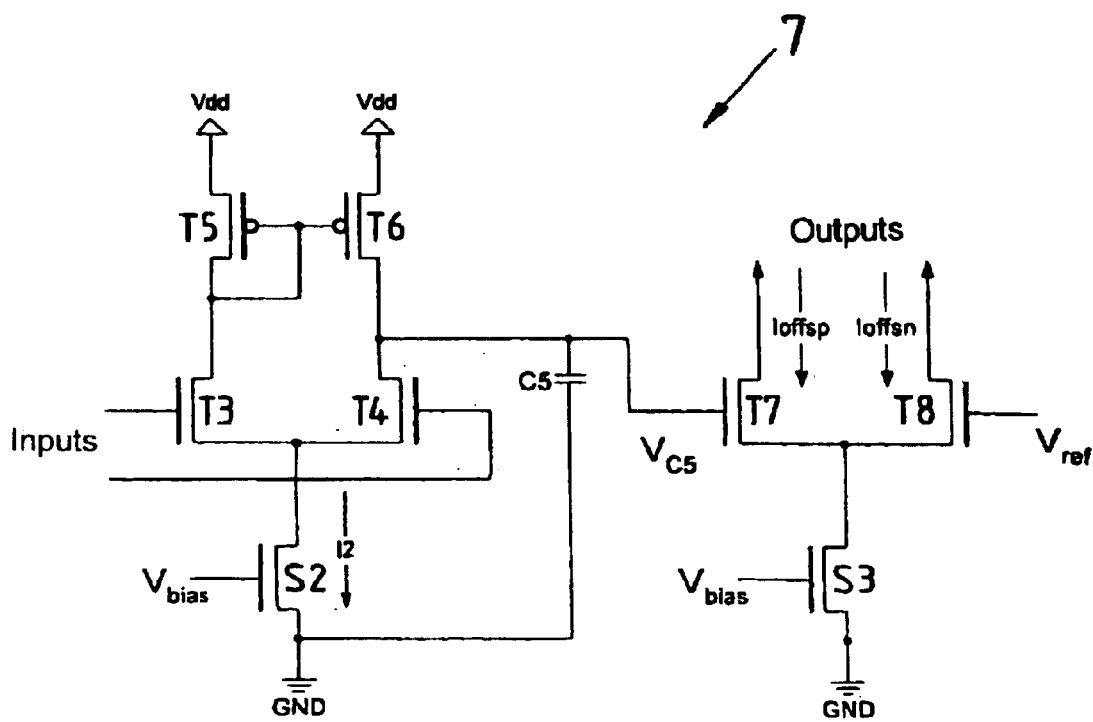
FIG. 7 is a circuit diagram showing a second integrator of FIG. 2.

An exemplary embodiment of the integrator 7 is illustrated in FIG. 7. The integrator of FIG. 7 has two input transistors T3, T4, two transistors T5, T6 complementary thereto, two output transistors T7, T8, two current sources S2, S3 and a capacitor C5. The drain terminals of the input transistors T3, T4 are respectively connected to the supply voltage Vdd via a complementary transistor T5, T6. In addition, the gate terminals of the two complementary transistors T5, T6 are interconnected and connected to the drain terminal of one input transistor T3. The drain terminal of the other input transistor T4 is connected to the capacitor C5. The other terminal of the capacitor C5 is connected to ground.

The circuit functions in such a way that the difference between the output signals Ep, En of the two inverters In1, In2 which is present at the input transistors T3, T4 is integrated. The output voltage VC5 is applied via the capacitor C5 to the output transistor T7, whose drain terminal together with the drain terminal of the further transistor T8, whose gate voltage is defined by a reference value Vref, forms the outputs of the integrator. The source terminals of the output transistors T7, T8 are interconnected and connected to the current source S3.

Two correction currents $I_{offsp}$ and $I_{offsn}$ are provided on the output side, which currents are both the inverse of each other and are fed to the second differential amplifier 2. The time constant of the control is set by way of the integrator time constant T2, which is established from the capacitor C5 and the current I2 through the first current source S2.

Figure 5A:
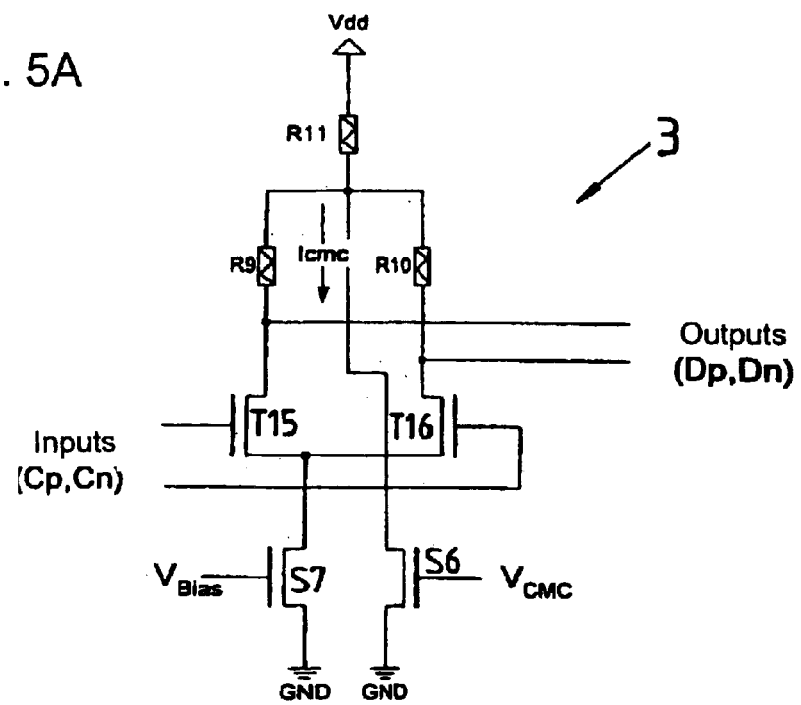
FIG. 5A is a circuit diagram showing an exemplary embodiment of a second differential amplifier used in FIG. 2.
Figure 5B:
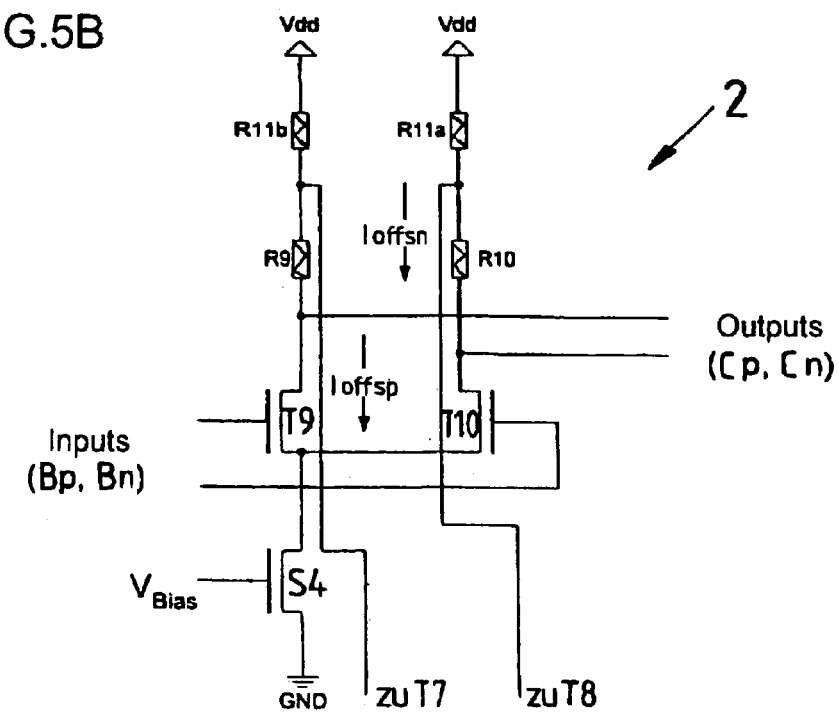
FIG. 5B is a circuit diagram showing an exemplary embodiment of a third differential amplifier used in FIG. 2.

An exemplary configuration of the second differential amplifier is illustrated in FIG. 5B. Firstly, the differential amplifier of FIG. 5B has a differential amplifier similar to the differential amplifier of FIG. 4 with two input transistors T9, T10 and a current source S4. The drain terminals of the transistors T9, T10 are respectively connected to the voltage Vdd via two resistors R9, R11b and R10, R11a. The outputs of the first integrator 7 are respectively connected to a reference point between the respective resistors R9, R11b; R10, R11a. When a current Ioffsp or Ioffsn flows, a differential DC current is fed into the second differential amplifier 2, which leads to a change in the levels of the differential output Cp, Cn, an offset correction being effected.

Figure 8:
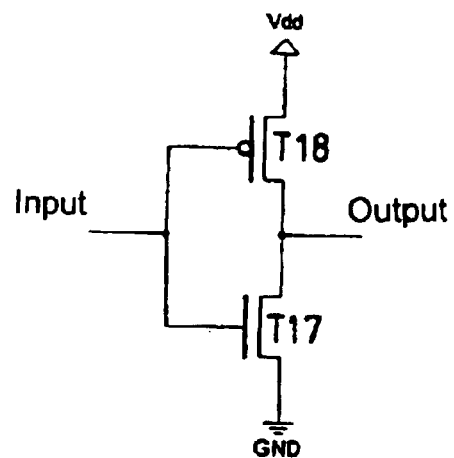
FIG. 8 is a circuit diagram-showing an inverter of FIG. 2.

A further circuit section of the generator circuit of FIG. 2 is realized by a controller for driving the two inverters In1, In2. The inverters In1, In2 are illustrated in FIG. 8. They are customary CMOS inverters with two MOS transistors T17, T18, a n-channel MOS transistor T17 and a p-channel MOS transistor T18, which are of complementary configuration and are connected in series. The transistor T17 is connected to the reference-ground potential GROUND by its source terminal and the transistor T18 is connected to the operating voltage Vdd by its source terminal.

If the input voltage LOW is present at the input node, the transistor T17 turns off and the output is pulled to the operating voltage Vdd. By contrast, if the input voltage at the input node assumes the value HIGH, the upper transistor T18 turns off and the output is pulled to ground. CMOS inverters of this type are known per se.

Figure 9:
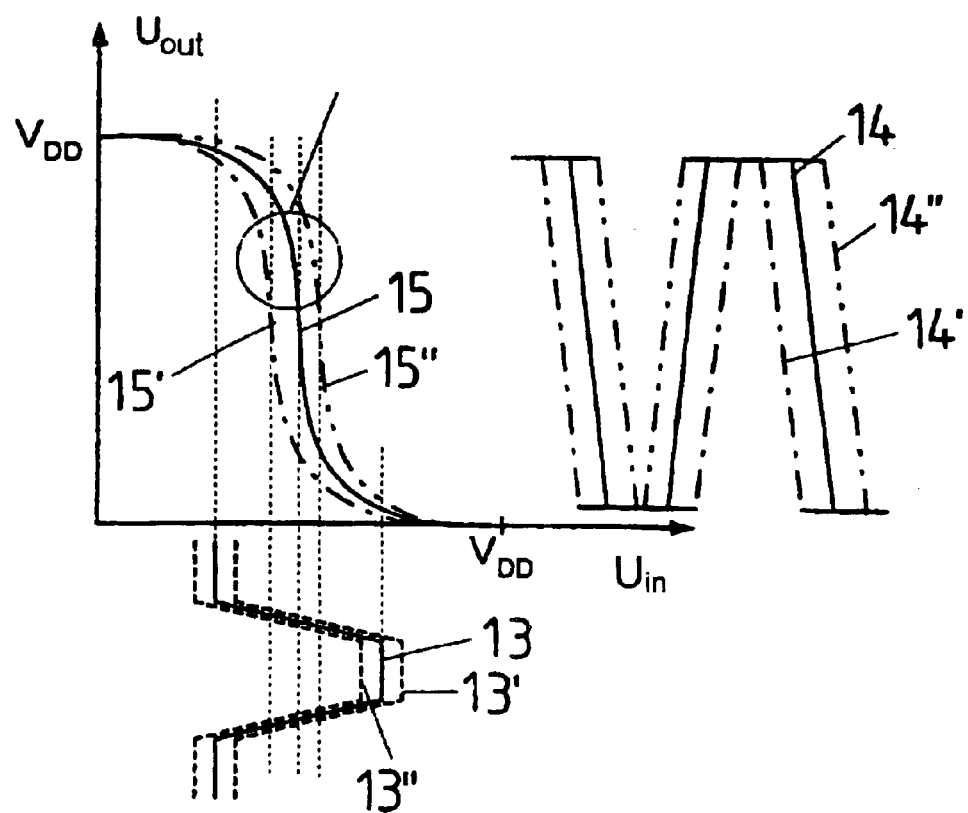
FIG. 9 is a graph showing a characteristic curve, an input pulse shape, and an output pulse shape—mirrored at the characteristic curve—of an inverter in accordance with FIG. 8.

The background of the control circuit for driving the two inverters which is explained below is the fact that the switching points of CMOS inverters vary greatly over process tolerances and temperature. Such an inverter characteristic is illustrated in FIG. 9. A distortion of the output pulse shape 14 results in a manner dependent on the absolute level position of the input signal 13. In this case, the output pulse shape is produced by mirroring the input pulse shape 10 at the characteristic curve 15 of the inverter. In this case, the signal waveforms 14, 14', 14" of the output pulse shape correspond to the respective characteristic curves 15, 15', 15" of the inverter (identical broken form), the unbroken input pulse shape being taken as a basis.

The desired control is intended to be effected such that the unbroken output pulse shape 14 is always intended to be present. In view of the unavoidable characteristic curve fluctuation, this is achieved in that an offset correction is effected by way of the input pulse shape in order to obtain the solid output characteristic curve in the event of characteristic curve fluctuations. Examples of correspondingly offset-corrected input pulse shapes are illustrated by broken lines (pulses 13', 13").

In other words, the pulse distortion at the output is intended to be minimized by the absolute level position of the input signal or input pulse. The setting of the absolute level position of the input signal for the inverters In1, In2 is effected by a control loop with the second integrator 8 serving as control amplifier. The controlled variable for the control is obtained from the average value of the two outputs Ep, En of the two inverters In1, In2. The average value is provided by the voltage divider 4 having two resistors R1, R2 and a capacitor C2. In this case, the resistors are connected in series between the outputs of the inverters In1, In2. The resistors R1, R2 generally have the same value, at any rate provided that the clock signal is symmetrical as usual. The voltage present between the two resistors R1, R2 is fed to the integrator 8 as an input signal.

The second input signal for the integrator is likewise provided by a voltage divider 5 with the resistors R3, R4 and a capacitor C2. The voltage divider 5 provides a desired value. The difference between the input signals is integrated by the integrator 8. The integrator 8 then makes a control voltage Vcmc available to the third differential amplifier 3, which is connected downstream of the second differential amplifier 2 and outputs the drive signals for the two inverters In1, In2.

Figure 6:
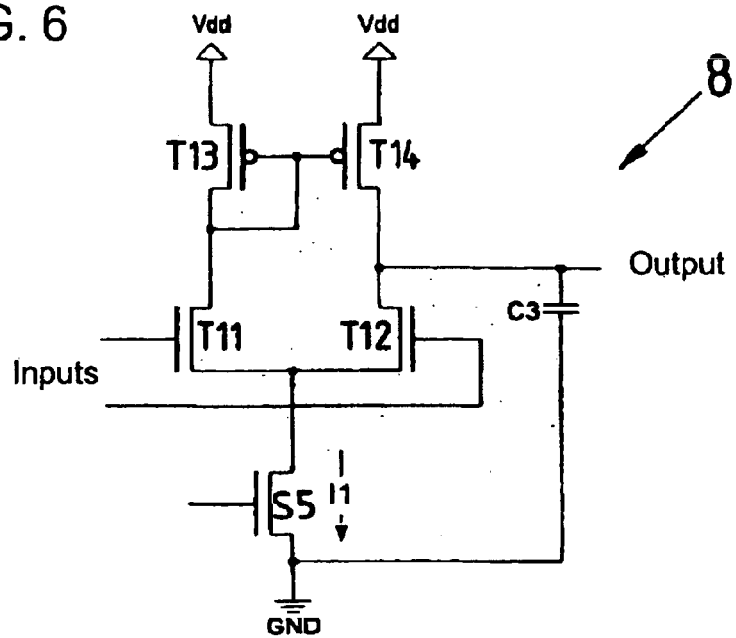
FIG. 6 is a circuit diagram showing a first integrator used in FIG. 2.

An exemplary embodiment of the first integrator is illustrated in FIG. 6. Accordingly, this integrator, in a manner similar to the integrator 7 of FIG. 7, includes two input transistors T11, T12, two transistors T13, T14 complementary thereto, a current source S5 and a capacitor C3, at which the output voltage Vcmc is present.

The third differential amplifier 3 is illustrated in FIG. 5A. The output voltage Vcmc of the second integrator serves for controlling a current source S6 of the third differential amplifier. The latter, in a manner similar to the differential amplifiers described above, furthermore has two input transistors T15, T16, a current source S7 and two resistors R9, R10, R11, a respective one of the resistors R9, R10 being connected between the drain terminal of the transistors T15, T16 and the resistor 11. The control voltage Vcmc provided by the integrator 8 is then used to provide a current Icmc that flows to the current source S6 via a resistor R11. By using the current Icmc and the resistor R11, an offset voltage is superposed on the signal voltages Dp, Dn at the outputs of the third differential amplifier 3. As a result, the input pulse shape in accordance with FIG. 9 can be shifted to the optimum switching point of the inverter and an optimum output pulse shape can be achieved. In this case, on account of the previous circuit measures, it is assumed that the differential signal Dp, Dn has already been set optimally and only the level position, i.e. the offset for the inverter switching point, is to be set.

Figure 5C:
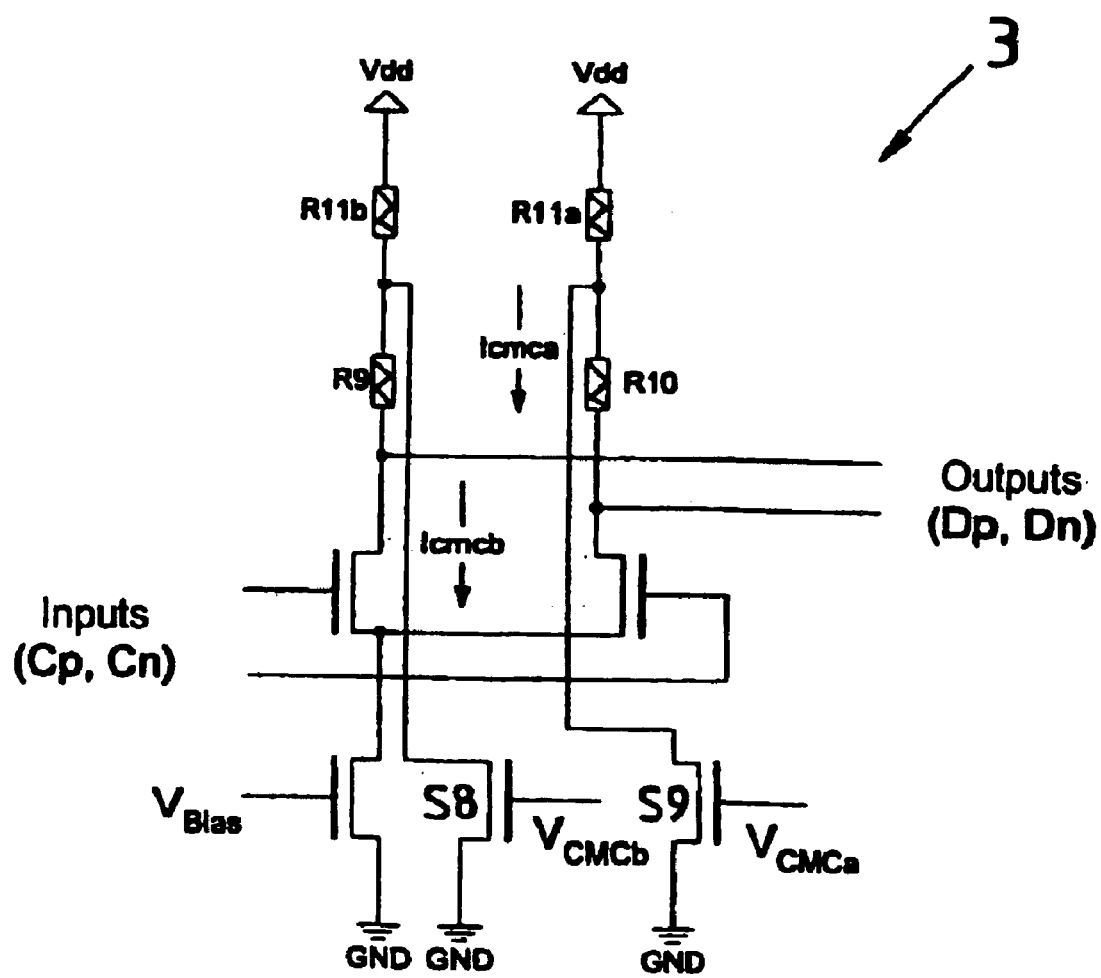
FIG. 5C is a circuit diagram showing an alternate embodiment of the differential amplifier of FIG. 5A.

Usually, it is not necessary to construct a separate control for each inverter In1, In2, since the inverters on a chip behave identically. However, if a separate control is included, two integrators are provided and the amplifier is modified as illustrated in FIG. 5C. Accordingly, for each output Dp, Dn, the offset is set separately by a separate current source S8, S9, which is respectively controlled by a voltage Vcmcb, Vcmca. For the rest, the circuit of FIG. 5c corresponds to the circuit of FIG. 5b.

The corrected output signal of the inverters In1, In2 is fed to a circuit to be supplied. Furthermore, the line driver 6 is constructed as a further differential amplifier, for example. The line driver 6 provides the signal for further transmission on transmission lines 11, 12 to the next circuit section. The output signals of the line driver 6 are identified by Fp, Fn.

Figure 3:
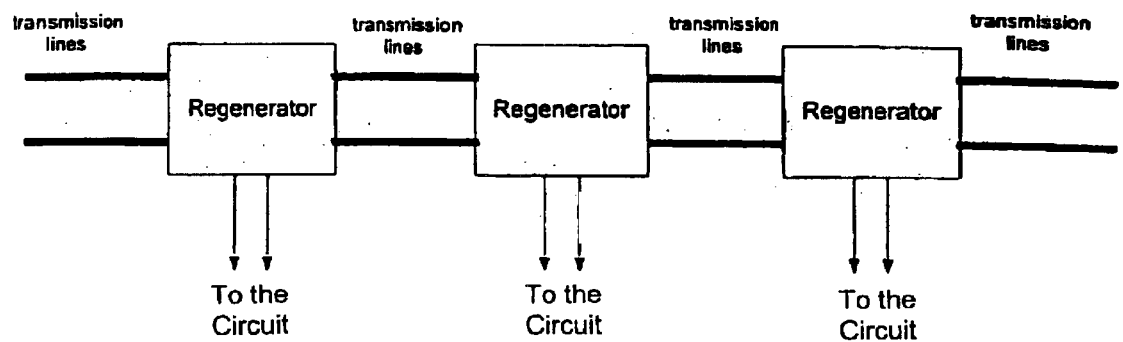
FIG. 3 is a block diagram showing a configuration of circuit configurations in accordance with FIG. 2.

A typical application of the regenerator circuit of FIG. 2 is illustrated in FIG. 3. Accordingly, a plurality of regenerator circuits in accordance with FIG. 2 are connected in series. From each regenerator circuit, a regenerated clock signal is in each case transmitted to a circuit to be clocked. Instead of the series circuit shown, a star-shaped configuration is also conceivable, as is usually employed for clock distribution.

I claim:

1. A circuit configuration for regenerating clock signals, comprising:

an input differential amplifier generating first and second amplified signals in response to first and second differential input clock signals;

first and second inverters generating respective first and second differential output clock signals; and an offset compensation circuit coupled to said first and said second inverters and adjusting a difference between the two output clock signals to a constant value, said offset compensation circuit further connected to said input differential amplifier and receiving the first and second amplified signals, said offset compensation circuit containing:

a control amplifier having an input receiving the two output clock signals and outputting output signals derived from the output clock signals; and a further differential amplifier generating first and second amplified, offset-compensated signals from the first and second amplified signals of said input differential amplifier and the output signals of said control amplifier and feeding the first and second amplified, offset-compensated signals as drive signals to said inverters.

2. The circuit configuration according to claim 1, wherein said first and said second inverters generate the first and the second differential output clock signals from the first and second amplified signals.

3. The circuit configuration according to claim 1, wherein the constant value is zero.

4. The circuit configuration according to claim 1, wherein all of the circuit components are embodied using CMOS technology.

5. The circuit configuration according to claim 1, wherein said further differential amplifier feeds the first and second amplified, offset-compensated signals directly to said inverters.

6. The circuit configuration according to claim 1, wherein said further differential amplifier feeds the first and second amplified, offset-compensated signals to said inverters via a further component.

7. The circuit configuration according to claim 6, wherein said further component is a further differential amplifier.

8. The circuit configuration according to claim 1, further comprising an additional control circuit for driving said two inverters to shift input pulse shapes of said inverters to an optimum switching point of said inverters.

9. The circuit configuration according to claim 8, wherein said control circuit for driving said two inverters has:

a further control amplifier having an input receiving an average value of the first and second differential output clock signals and a desired value, and a third differential amplifier generating first and second drive signals for said first and second inverters in response to the first and second amplified offset-compensated signals of said differential amplifier and the output signal of said second control amplifier.

10. The circuit configuration according to claim 9, wherein:
said third differential amplifier has a current source, said current source providing a current to correct a duty cycle distortion of said first and second inverters by applying an offset voltage to drive signals for said first and second inverters; and
said output of said further control amplifier controls said current source of said third differential amplifier.

11. The circuit configuration according to claim 9, wherein:
said third differential amplifier controls two current sources providing respective currents; and
said current sources provide respective offset voltages, the respective offset voltages being applied to drive signals for said first and second inverters to correct a duty cycle distortion of said first and second inverters.

12. The circuit configuration according to claim 9, wherein said further control amplifier is an integrator.

13. The circuit configuration according to claim 12, further comprising a voltage divider circuit providing an average value of the first and second differential output clock signals;
said integrator receiving an input signal representing the average value of the first and second differential output clock signals provided by said voltage divider circuit.

14. The circuit configuration according to claim 12, further comprising a voltage divider circuit providing an input signal to said integrator representing the desired value.

15. The circuit configuration according claim 1, wherein said control amplifier is an integrator providing two input signals for said second differential amplifier for offset compensating the two differential output signals of said second differential amplifier.

16. The circuit configuration according to claim 15, wherein said integrator has an input; and
a high-frequency filter is connected upstream of said input of said integrator.

17. The circuit configuration according to claim 15, wherein, said second differential amplifier superposes an offset voltage on the two output signals by using a resistor and two currents controlled by said first integrator.

18. The circuit configuration according to claim 1, wherein the differential output clock signals are fed to a differential line driver.

19. A circuit configuration for regenerating clock signals, comprising:
an input differential amplifier generating first and second amplified signals in response to first and second differential input clock signals;
first and second inverters connected to said input differential amplifier and generating respective first and second differential output clock signals from the first and second amplified signals, said inverters having respective input pulse shapes and an optimum switching point; and
a control circuit receiving at least one of the first and second differential output clock signals, said control circuit driving said inverters and shifting the input pulse shapes of said inverters to the optimum switching point of said inverters, said control circuit containing:
a control amplifier having an input receiving an average value of the first and second differential output clock signals and a desired value and outputting an output signal; and
a differential amplifier generating first and second drive signals for said first and second inverters in response to the output signal of said control amplifier and input signals fed by one of said input differential amplifier and a component connected downstream thereof.

* * * * *